(12) United States Patent
Shields et al.

(10) Patent No.: US 6,350,696 B1
(45) Date of Patent: Feb. 26, 2002

(54) SPACER ETCH METHOD FOR SEMICONDUCTOR DEVICE

(75) Inventors: Jeffrey A. Shields, Sunnyvale; Jeffrey P. Erhardt, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/671,209

(22) Filed: Sep. 28, 2000

(51) Int. Cl.$^7$ .............................. H01L 21/302
(52) U.S. Cl. ............... 438/704; 438/696; 438/305; 438/592; 438/595; 438/655; 438/682; 438/734; 438/750
(58) Field of Search .................... 438/305, 592, 438/595, 655, 682, 704, 723, 734, 743, 750, 756, 696

(56) References Cited

U.S. PATENT DOCUMENTS

| | | | |
|---|---|---|---|
| 5,834,346 A | * 11/1998 | Sun et al. | 438/231 |
| 5,937,301 A | 8/1999 | Gardner et al. | 438/303 |
| 6,103,611 A | 8/2000 | En et al. | 438/595 |

* cited by examiner

*Primary Examiner*—George Goudreau
(74) *Attorney, Agent, or Firm*—Harrity & Snyder, L.L.P.

(57) ABSTRACT

Spacers are formed on a semiconductor device by depositing a spacer layer on the semiconductor device. The semiconductor device is subjected to an anisotropic etching process to leave at least a portion of the spacer layer covering the semiconductor device. The semiconductor device is then subjected to an isotropic etching process to form the spacers on the semiconductor device.

3 Claims, 3 Drawing Sheets

SPACER ETCH METHOD FOR SEMICONDUCTOR DEVICE

TECHNICAL FIELD

The present invention relates to a method of manufacturing a semiconductor device. The present invention has particular applicability to manufacturing high density semiconductor devices with submicron design features.

BACKGROUND ART

A continuing trend in semiconductor technology is to build integrated circuits with more and/or faster semiconductor devices. This trend has resulted in continued shrinking of device and circuit dimensions and features. In integrated circuits having transistors, for example, one very important process step is the formation of the gate, source, and drain regions for each of the transistors and, in particular, the dimensions of the gate, source, and drain regions. Often, the performance characteristics (e.g., switching speed) and size of the transistor are functions of the size.(e.g., width) of the transistor's gate, and the placement of the source and drain regions. Thus, for example, a narrower gate tends to produce a higher performance transistor (e.g., faster) that is inherently smaller in size (e.g., narrower width).

As is often the case, however, as devices shrink in size from one generation to the next, some of the existing fabrication techniques are not precise enough to be used in fabricating the next generation of integrated circuit devices. For example, spacers are used in conventional semiconductor devices to provide alignment of the source and drain regions to the gates in transistors. Spacers also shadow implants to "space" them away from the transistors.

FIGS. 1–3 illustrate a conventional process for forming spacers on a semiconductor device. In FIG. 1, a cross-section of a portion of a conventional semiconductor device 100 is illustrated. The semiconductor device 100 includes a substrate 110, gate electrodes 120, and gate insulating layers 130. The gate electrodes 120 are formed on the substrate 110 and may include some type of polysilicon, such as an undoped poly, an amorphous poly, a doped poly, a poly with silicide on top, etc. The gate electrodes 120 are typically insulated from the substrate 110 by a thin gate insulating layer 130 made of oxide or oxide-nitride-oxide (ONO).

In FIG. 2, a spacer layer 210 is formed over the substrate 110 and gate electrodes 120 using well known deposition techniques, such as chemical vapor deposition (CVD) or tetraethyl orthosilicate (TEOS) deposition techniques. The spacer layer 210 may include an oxide or nitride insulator, such as silicon oxide, silicon nitride, or silicon-oxynitride.

In FIG. 3, the semiconductor device 100 is subjected to anisotropic etching to etch the spacer layer 210 material to form a spacer 310 along the edges of the gate electrodes 120. The anisotropic etch is typically a plasma reactive-ion etch employing a fluorine-based gas chemistry, such as $CF_4$, $CHF_3$, $SF_6$, $C_4F_8$, $CH_3F$, etc., diluted with an inert gas, such as Argon or Helium, or a chlorine or bromine based etch. The conformal nature of the spacer layer 210 deposition produces thicker films at the edges of a gate electrode 120 than on the flat areas. The directional nature of the anisotropic etch removes the same amount of space layer 210 material vertically in all places, leaving a spacer 310 next to the edge of the gate electrode 120.

During the etching process, the silicon 320 between the transistors may be damaged by the plasma etch. It is also possible that the gate insulating layer 130 can be charged when exposed to plasma and, thus, damaged. Such damage may cause current to leak between adjacent transistors on the semiconductor device 100.

DISCLOSURE OF THE INVENTION

There exists a need for a spacer etch process that prevents damage-induced leakage current. This and other needs are met by the present invention, where a two-step etching process is implemented. The two-step etching process includes a combination of anisotropic and isotropic etching to prevent the silicon and gate insulating layer from being damaged by the plasma etching process.

Additional advantages and other features of the invention will be set forth in part in the description that follows and in part will become apparent to those having ordinary skill in the art upon examination of the following or may be learned from the practice of the invention. The advantages and features of the invention may be realized and obtained as particularly pointed out in the appended claims.

According to the present invention, the foregoing and other advantages are achieved in part by a method of forming spacers on a semiconductor device. The method includes depositing a spacer layer on the semiconductor device. The semiconductor device is subjected to an anisotropic etching process to leave at least a portion of the spacer layer covering the semiconductor device. The semiconductor device is then subjected to an isotropic etching process to form the spacers on the semiconductor device.

In another implementation consistent with the present invention, a method prevents damage-induced leakage current when forming spacers on a semiconductor device multiple gate electrodes. The method includes depositing an insulation layer on the semiconductor device to a first thickness; anisotropically etching the insulation layer to remove a portion of the insulation layer, a remaining portion of the insulation layer being of a second thickness; and isotropically etching the insulation layer of the second thickness to form the spacers adjacent to the gate electrodes on the semiconductor device.

In yet another implementation consistent with the present invention, a spacer etch method includes subjecting a semiconductor device having a spacer layer deposited thereon to an anisotropic etching process to leave approximately 200–400 Å of the spacer layer covering the semiconductor device; and subjecting the semiconductor device to an isotropic etching process to form one or more spacers on the semiconductor device.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation represent like elements throughout.

BEST MODE FOR CARRYING OUT THE INVENTION

The present invention addresses and solves the problems associated with forming spacers on a semiconductor device by employing a two-step etching process. FIGS. 4–7 illustrate a process for forming spacers on a semiconductor device according to an implementation consistent with the present invention.

Figure 1:
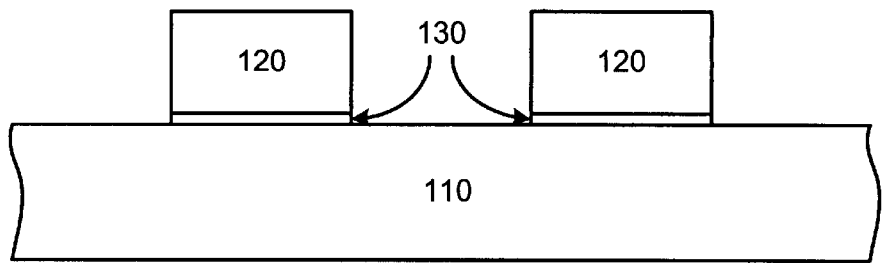
FIGS. 1–3 illustrate a conventional process for forming spacers on a semiconductor device.
Figure 2:
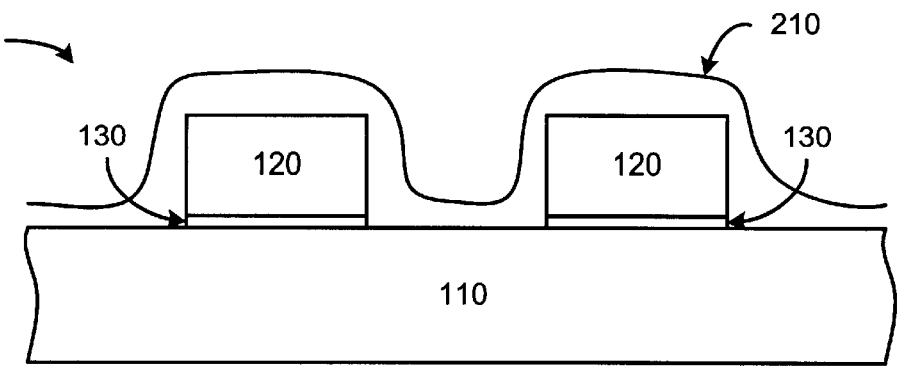
Figure 3:
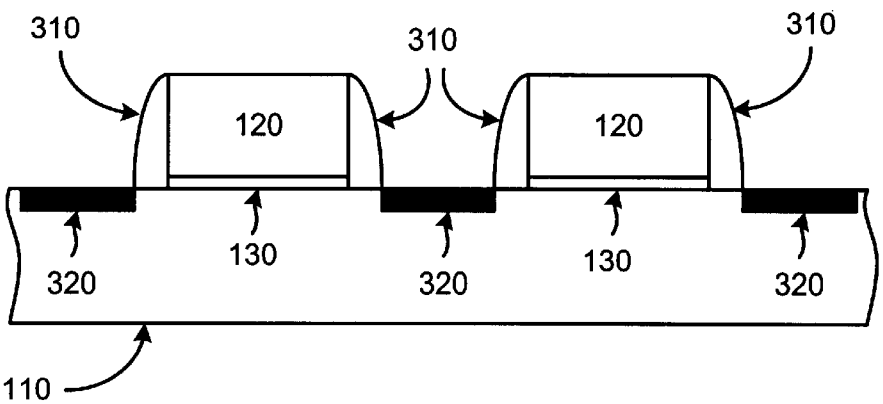
Figure 4:
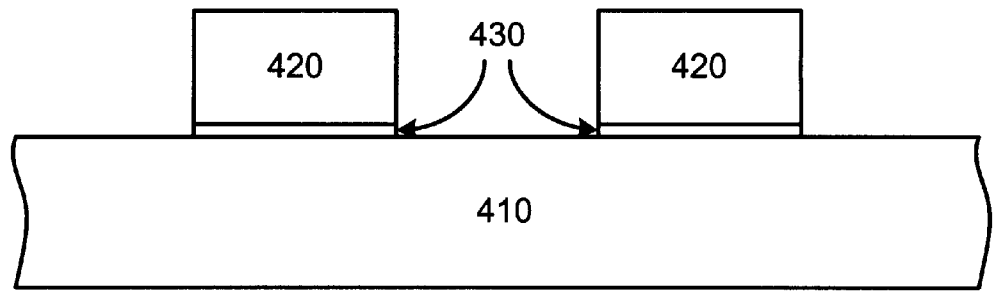
FIGS. 4–7 illustrate a process for forming spacers on a semiconductor device according to an implementation consistent with the present invention.

In FIG. 4, a cross-section of a portion of a semiconductor device 400 is illustrated. The semiconductor device 400 includes a substrate 410, gate electrodes 420, and gate insulating layers 430. Two gate electrodes 420 have been shown in FIG. 4 for simplicity. The gate electrodes 420 are formed on the substrate 410 and may include some type of polysilicon, such as an undoped poly, an amorphous poly, a doped poly, a poly with silicide on top, etc. The gate electrodes 420 may be insulated from the substrate 410 by a thin gate insulating layer 430, such as an oxide or oxide-nitride-oxide (ONO) layer.

Figure 5:
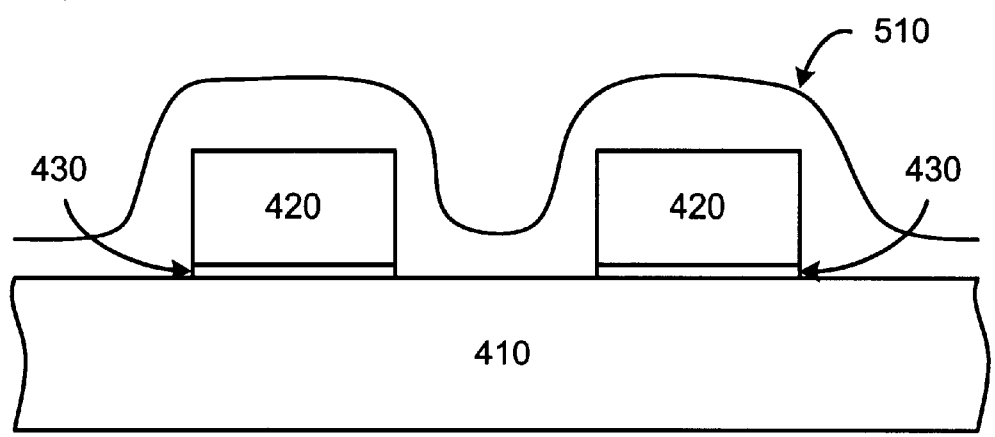

In FIG. 5, a spacer layer 510 is formed over the substrate 410 and gate electrodes 420 using well known deposition techniques, such as chemical vapor deposition (CVD) or tetraethyl orthosilicate (TEOS) deposition techniques. The spacer layer 510 may include an oxide or nitride insulator, such as silicon oxide, silicon nitride, or silicon-oxynitride. In implementations consistent with the present invention, the spacer layer 510 may be applied approximately 300 Å thicker than conventional applications. For example, the spacer layer 510 may be deposited to a thickness ranging from approximately 500 Å to 2500 Å.

Figure 6:
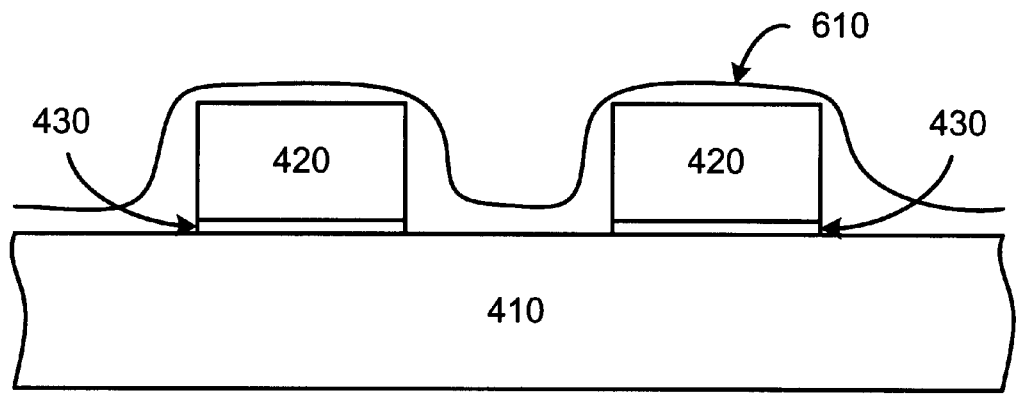

In FIG. 6, the semiconductor device 400 is subjected to anisotropic etching to etch the spacer layer 510 material. The anisotropic etch may include a plasma reactive-ion etch employing a fluorine-based gas chemistry, such as $CF_4$, $CHF_3$, $SF_6$, $C_4F_8$, $CH_3F$, etc., diluted with an inert gas, such as Argon or Helium, or a chlorine or bromine based etch.

Unlike in the conventional approach, the anisotropic etching may underetch the spacer layer 510 material, leaving spacer material 610 on the semiconductor device 400 and encapsulating the gate electrodes 420 and the gate insulating layers 430. The inventors of the present invention have found that by using a shortened plasma etch that leaves about 200–400 Å (e.g., 300 Å) of spacer material 610, the occurrence of transistor leakage and damage to the semiconductor device 400 may be prevented. Given the guidance disclosed herein, the particular amount of spacer material 610 left on the semiconductor 400 may be optimized to prevent leakage.

Figure 7:
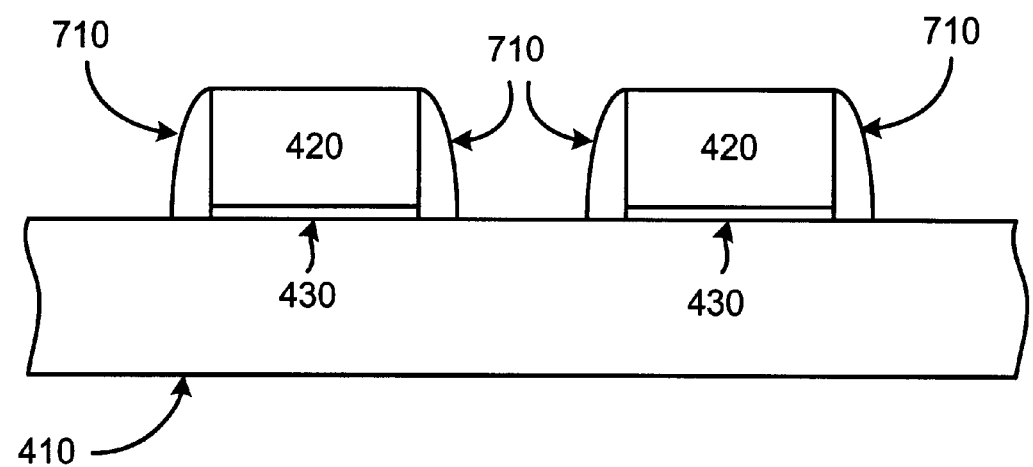

In FIG. 7, the semiconductor device 400 is subjected to a short isotropic etch to remove the remaining spacer material 610, thereby forming spacers 710 along the sidewalls of the gate electrodes 420. The isotropic etch may include a wet etch using, for example, dilute hydrofluoric acid (DHF) or a buffered oxide etch (BOE) of 40:1 $NH_4F{:}HF$. Because the isotropic etch may cause the spacer material 610 to be narrowed, the original deposition of the spacer layer 510 (FIG. 5) is made thicker by an appropriate amount, such as 300 Å, to compensate. The inventors of the present invention have found that a short wet dip does not affect the profile or shape of the spacers 710 to a significant degree. An additional advantage of the invention is that if ONO is employed as the gate insulating layer 430, the BOE or DHF will stop on the nitride layer, thereby ensuring that the gate insulating layer 430 is not etched away.

The present invention addresses and solves the problems associated with forming spacers by employing a two-step etching process to form the spacers. Through a combination of anisotropic and isotropic etching to form the spacers, damage to the semiconductor device and transistor leakage may be prevented.

In the previous descriptions, numerous specific details are set forth, such as specific materials, structures, chemicals, processes, etc., in order to provide a thorough understanding of the present invention. The present invention can be practiced, however, without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of chemical vapor deposition (CVD) processes, including low pressure chemical vapor deposition (LPCVD) and enhanced chemical vapor deposition (ECVD) can be employed.

The present invention is applicable in the manufacturing of semiconductor devices and particularly in semiconductor devices with submicron design features, resulting in increased transistor and circuit speeds and improved reliability. The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

What is claimed is:

1. A method of forming spacers on a semiconductor device, comprising:

providing a semiconductor substrate;

forming a plurality of gate electrodes on the semiconductor substrate using polysilicon;

forming an insulating layer between each of the gate electrodes and the semiconductor substrate, each of the insulating layers comprising an oxide-nitride-oxide material to insulate the gate electrode from the semiconductor substrate;

depositing a spacer layer, comprised of oxide or nitride insulating material, over the gate electrodes and the semiconductor substrate to a thickness of approximately 500 Å;

anisotropically etching, using a plasma reactive-ion etching process, the spacer layer to leave approximately 400 Å of the spacer layer covering the semiconductor device; and isotropically etching, using a dilute hydrofluoric or buffered oxide etching process, the portion of the spacer layer to form the spacers on the semiconductor device, the isotropic etching stopping at the nitride material of the insulating layer.

2. A method of forming spacers on a semiconductor device comprising:

providing a semiconductor substrate;

forming a plurality of gate electrodes on the semiconductor substrate using polysilicon;

forming an insulating layer between each of the gate electrodes and the semiconductor substrate, each of the insulating layers comprising an oxide-nitride-oxide material to insulate the gate electrode from the semiconductor substrate;

depositing a spacer layer, comprised of oxide or nitride insulating material, over the gate electrodes and the semiconductor substrate to a thickness of approximately 2,500 Å;

anisotropically etching, using a plasma reactive-ion etching process, the spacer layer to leave approximately 400 Å of the spacer layer covering the semiconductor device; and isotropically etching, using a dilute hydrofluoric or buffered oxide etching process, the portion of the spacer layer to form the spacers on the semiconductor device, the isotropic etching stopping at the nitride material of the insulating layer.

3. A method of forming spacers on a semiconductor device, comprising:

providing a semiconductor substrate;

forming a plurality of gate electrodes on the semiconductor substrate using polysilicon;

forming an insulating layer between each of the gate electrodes and the semiconductor substrate, each of the insulating layers comprising an oxide-nitride-oxide material to insulate the gate electrode from the semiconductor substrate;

depositing a spacer layer, comprised of oxide or nitride insulating material, over the gate electrodes and the semiconductor substrate to a thickness of 1,000 Å;

anisotropically etching, using a plasma reactive-ion etching process, the spacer layer to leave 400 Å of the spacer layer covering the semiconductor device; and isotropically etching, using a dilute hydrofluoric or buffered oxide etching process, the portion of the spacer layer to form the spacers on the semiconductor device, the isotropic etching stopping at the nitride material of the insulating layer.

* * * * *